United States Patent
Villa et al.

[11] Patent Number: 5,818,763
[45] Date of Patent: Oct. 6, 1998

[54] ERASING METHOD FOR A NON-VOLATILE MEMORY

[75] Inventors: Corrado Villa, Sovico; Marco Defendi, Sulgiate; Luigi Bettini, Cavenago Brianza, all of Italy

[73] Assignee: SGS-Thomson Micrelectronics, S.r.l., Agrate Brianza, Italy

[21] Appl. No.: 774,860

[22] Filed: Dec. 24, 1996

[30] Foreign Application Priority Data

Dec. 29, 1995 [EP] European Pat. Off. .............. 95830554

[51] Int. Cl.⁶ ...................................... G11C 7/00
[52] U.S. Cl. ...................... 365/185.29; 365/218
[58] Field of Search ................ 365/185.29, 218

[56] References Cited

U.S. PATENT DOCUMENTS

| | | | |
|---|---|---|---|
| 5,270,979 | 12/1993 | Harari et al. ............................. | 365/218 |
| 5,434,825 | 7/1995 | Harari ................................. | 365/185.29 |
| 5,557,572 | 9/1996 | Sawada et al. ..................... | 365/185.29 |
| 5,596,530 | 1/1997 | Lin et al. ............................ | 365/185.29 |
| 5,615,148 | 3/1997 | Yamamura et al. ............... | 365/185.29 |

FOREIGN PATENT DOCUMENTS

0392895 A3   3/1990   European Pat. Off. .
0678875 A1   4/1995   European Pat. Off. .

*Primary Examiner*—Son T. Dinh
*Attorney, Agent, or Firm*—Allen, Dyer, Doppelt, Milbrath & Gilchrist, P.A.

[57] ABSTRACT

The invention relates to a method of erasing an electrically programmable non-volatile memory device constructed as a multi-sector matrix memory and being of the type with an erase algorithm integrated into the device. The method comprises the following steps of: erasing some or all of the matrix sectors in parallel; subsequently reading and checking each erased sector; storing the address of a sector being checked when the issue of a check is unfavorable; carrying out a fresh parallel erasing step; and starting a new reading/checking step from the sector that has checked unfavorably.

21 Claims, 3 Drawing Sheets

ERASING METHOD FOR A NON-VOLATILE MEMORY

FIELD OF THE INVENTION

The present invention relates to a method of erasing an electrically programmable non-volatile memory device constructed as a matrix memory with multiple sectors and having an erase algorithm integrated into the device.

BACKGROUND OF THE INVENTION

The invention concerns a method of erasing a flash memory constructed as a multi-sector matrix memory, and the description will cover such an application for convenience of illustration. The invention also relates to an electrically programmable/erasable non-volatile memory device constructed as a multi-sector matrix memory and having an integrated resident erase algorithm. As those skilled in the art will readily recognize, in non-volatile integrated memory devices that can be electrically programmed—specifically of the flash type—the erase operation either affects the matrix as a whole or just some of its sectors.

A first known solution to the problem of erasing a flash memory provides an erase procedure which can be regarded as serial. FIG. 1 of the accompanying drawings shows an erase algorithm of the serial type for carrying out this first procedure. The algorithm will be described herein below with the references used in the flow chart blocks of FIG. 1 put in brackets. According to this procedure, at the end (ENDPULSE?) of the erase phase (ERASE) of a given sector, a checking cycle is initiated which involves reading (READ) the data stored in that sector of the memory. The reading is useful to check that each word has been erased from the memory.

If the read/check step comes out right (READ OK?=1), i.e. if a given memory word is actually erased, an address (INC_ADDR) is increased to read the next memory word to be checked. If that step comes out wrong (READ OK?=0), the procedure reverts to erasing (ERASE) the whole sector. The checking cycle is terminated when the last memory word (LASTADD?=1) of the sector is read. The erase/check step is performed sequentially for all the sectors by increasing the sector address (INC_SECT), up to the last sector (LASTSECT?) in the matrix. Unfortunately, such a procedure clearly involves very long erasing times.

It has recently been considered that a flash memory could be erased more efficiently in three basic steps: 1) a pre-programming step, to be carried out for each memory word or byte; 2) an erasing step proper, which affects a whole sector or several sectors in parallel and is carried out by an application of erase pulses; and 3) a sector checking step, carried out on each byte.

The erase pulses may be applied in parallel, i.e. simultaneously, even to all of the matrix sectors. The first and third steps are instead carried out individually on each sector. The state of the art already provides a method of parallel erasing, which will be explained herein below by means of a second algorithm, shown in FIG. 2.

Following a step of parallel erasing (PAR_ERASE) of some or all of the matrix sectors, the erase pulse is checked for its end (ENDPULSE?=1). At this stage, a counter is reset (RES_CONT) and the procedure goes over to the read (READ)/check (READ OK?) step, to be carried out for each byte. If the checking of a given word comes out right (READ OK?=1), the procedure moves to increasing the memory word address (INC_ADDR), up to the last word (LASTADD?) in that sector. On completion of the checking of one sector (LASTADD?=1), the procedure moves to increasing the sector address (INC_SECT) by resetting a flag (RES_FLAG). On the other hand, if the checking comes out wrong (READ OK?=0), the sector address is increased (INC_SECT) at once, and if the sector is other than the last sector for checking (LASTSECT?=0), the counter is reset (RES_CONT) again. When the sector under examination is the last sector to be checked (LASTSECT?=1), a final test is performed to make sure that all the sectors have been erased (ALLERASED?). Thus the procedure can be terminated (END). If not (ALLERASE?=0), the algorithm continues through a fresh erase step (PAR_ERASE).

While the above method can provide for the erasing of several sectors in parallel, it has a serious limitation in that, when the checking step does not come out right, it may become necessary to go once again through the checking of all the sectors that have just been erased, because the counter has been reset (RES_CONT). For example, a fresh check may be requested while the check being run is approaching its end; in this case, the checking step would also have to be carried out from the very beginning.

There exists a need in this field for a shortened erasing time, which time may total some ten seconds for a whole matrix. To gain a better idea of the times involved in the erasing of a flash memory, one should consider that the first pre-programming step requires some six seconds; erasing itself may consume as much as one second, and takes longer with the ageing of the memory device; the checking step requires approximately 100 ms. Thus, the erasing time proper is usually dominant; however, with the parallel erase method just described, most of the erasing time may be taken up by the checking step.

The underlying technical problem of this invention is to provide an erasing method which can utilize the parallel erasing of several sectors, and at the same time prevent the checking step from prevailing over the erasing proper. This would allow the limitations and drawbacks of the prior art solutions to be overcome.

SUMMARY OF THE INVENTION

The solution in accordance with this invention is a method for storing the address of a sector being checked at the time when an incorrect erasure of a memory word in that sector is detected. The fresh checking step that follows a fresh erase pulse would then start with the sector in question.

The method of the present invention is for erasing an electrically programmable non-volatile matrix memory device comprising multiple sectors and erase means for implementing an erase algorithm. The method preferably comprises the steps of; parallel erasing at least one of the matrix sectors; reading and checking each erased matrix sector; storing an address of a sector being checked when the check is unfavorable; carrying out a fresh parallel erasing step; and starting a new reading and checking step from the sector that has checked unfavorably. The method is preferably implemented in a flash memory.

The step of reading and checking preferably comprises reading and checking each word in a matrix sector. The method also preferably includes the step of increasing the address of the sector to be checked at the end of the reading and checking step, and the storing step is preferably carried out before increasing the address. In addition, the method preferably includes the steps of: increasing the address of the sector to be checked at the end of the reading and checking step; and loading the address of the sector being checked after the address of the sector is increased.

The method may further include the step of resetting a flag to have the sector address increased responsive to completion of a sector checking. The method also preferably further includes the step of performing a test, after the address loading step, to verify whether the sector in question was the last sector to be checked, and if not, resuming reading and checking.

Another aspect of the invention is directed to an electrically programmable non-volatile matrix memory device. The memory device preferably comprises multiple sectors, and means for implementing the algorithm described above. More particularly, the memory device preferably includes means for parallel erasing at least one of the matrix sectors; for reading and checking each erased matrix sector; for storing an address of a sector being checked when the check is unfavorable; for carrying out a fresh parallel erasing step; and for starting a new reading and checking step from a sector that has checked unfavorably.

DETAILED DESCRIPTION OF THE PREFERRED EMBODIMENTS

Figure 1:
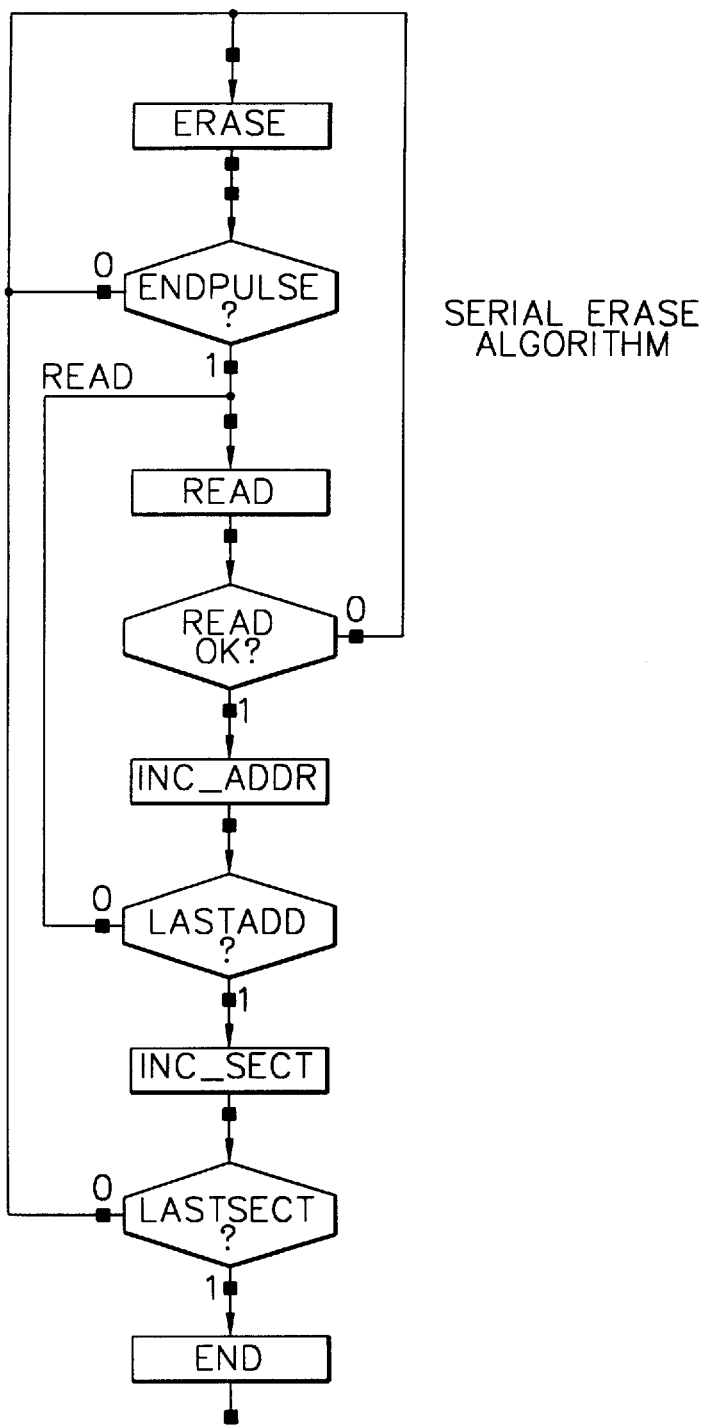
FIG. 1 is a diagram of an algorithm implementing a prior art serial erasing method.
Figure 2:
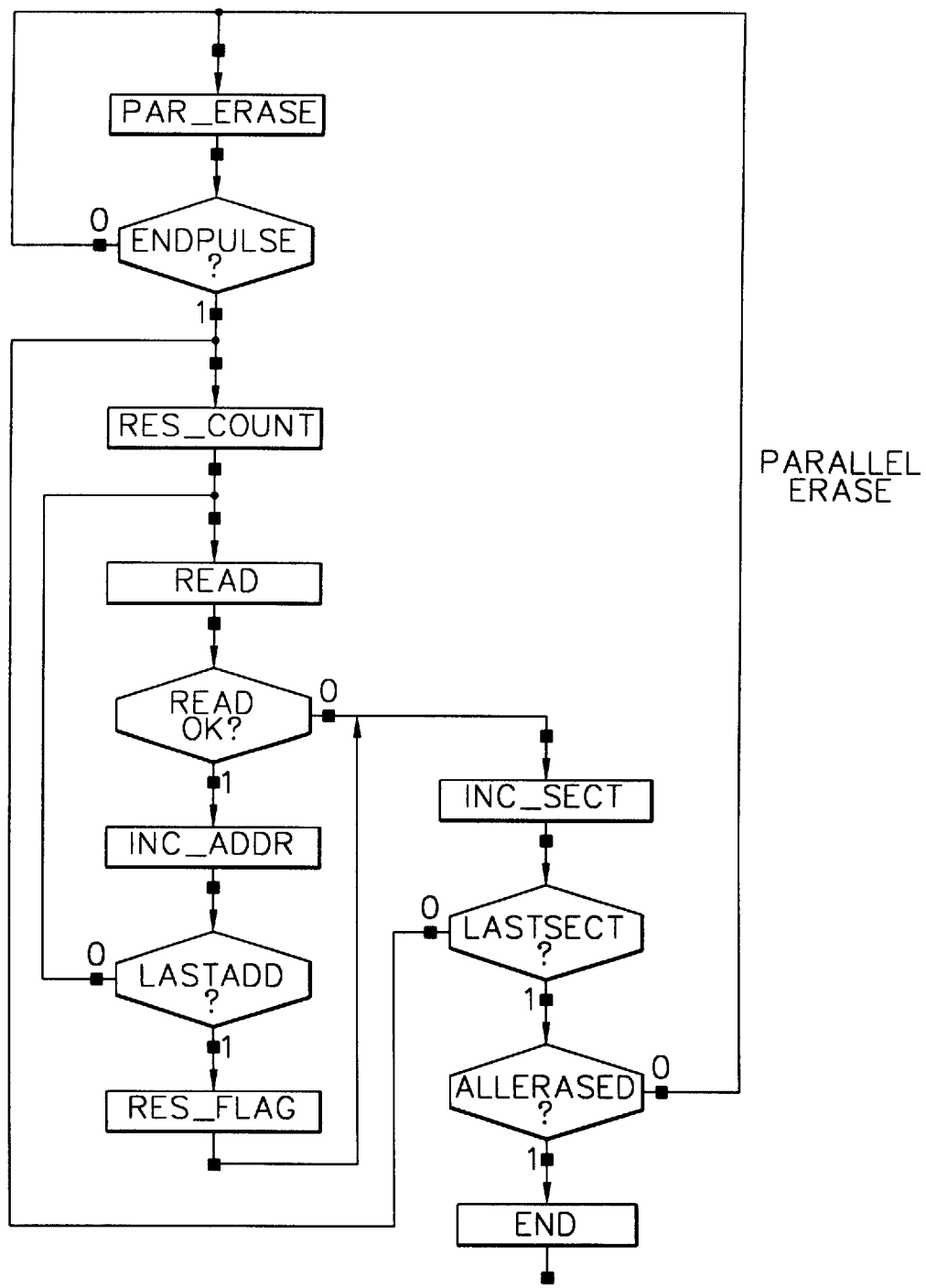
FIG. 2 is a diagram of an algorithm implementing a prior art parallel erasing method.
Figure 3:
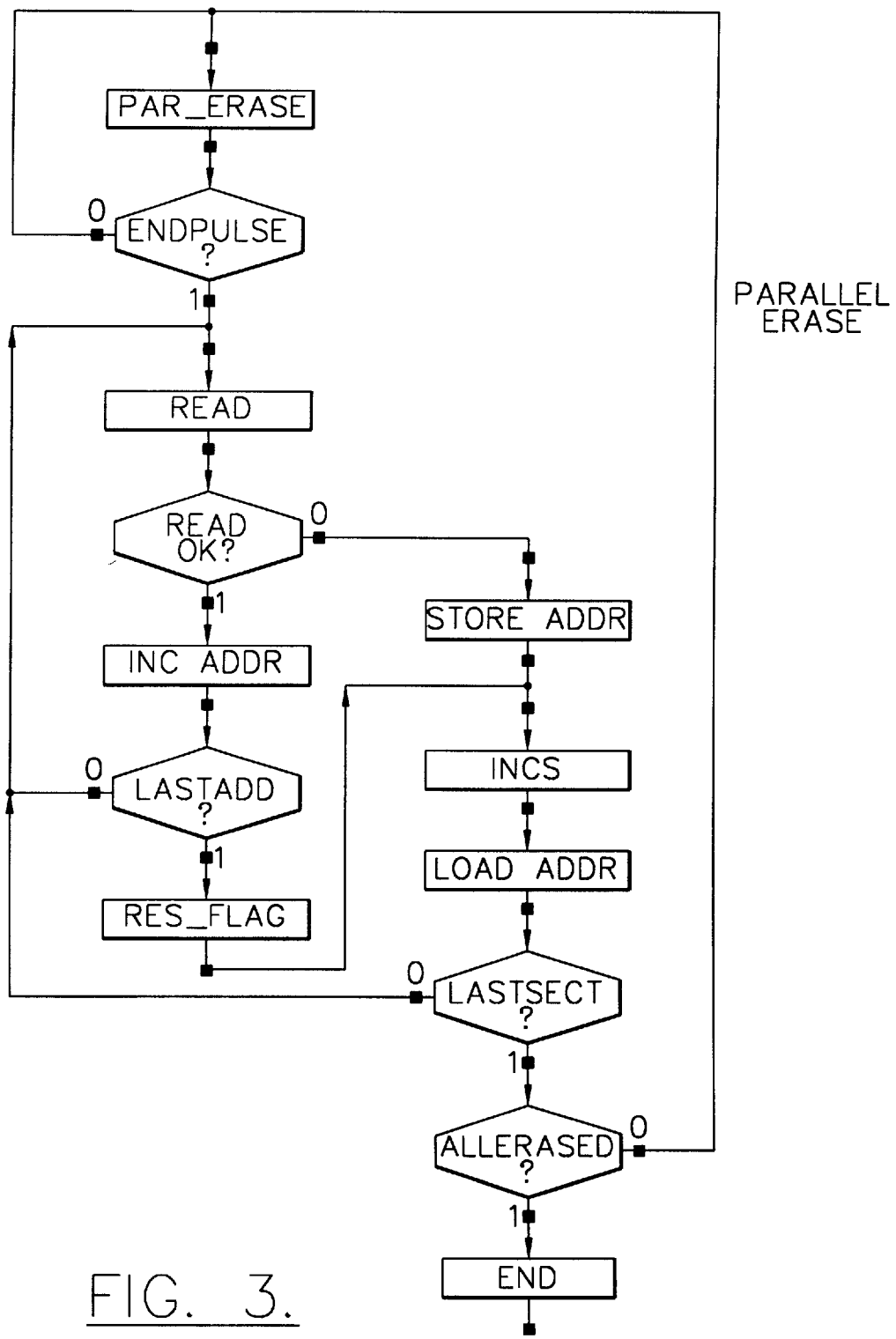
FIG. 3 is a diagram of an algorithm implementing the erasing method of this invention.

A description of FIGS. 1 and 2 has already been provided in the introductory paragraphs above, and will not be repeated to avoid overburdening the discussion of this invention. Referring in particular to the embodiment shown in FIG. 3, the multi-sector parallel erasing method according to the present invention will be described. The inventive method is particularly, but not exclusively, intended for an electrically programmable/erasable non-volatile memory device which is constructed as a multi-sector matrix memory and includes an integrated resident erase algorithm.

The algorithm that implements the method of this invention starts with a parallel erasing step which may affect several of the matrix memory sectors. After this parallel erasing (PAR_ERASE) of some or all of the matrix sectors, the erase pulse is checked for its end (ENDPULSE?). At this stage (ENDPULSE?=1), the algorithm moves to the reading (READ)/checking (READ OK?) step, to be carried out per byte. If a given word checks out right (READ OK?=1), the algorithm moves to increasing the address (INC_ADDR) of the memory word, up to the last word (LASTADD?) of that sector. Once the checking of one sector is completed (LASTADD?=1), the algorithm moves to increasing the sector address (INC_SECT) by resetting a flag (RES_FLAG).

Advantageously, according to the invention, if a check comes out wrong (READ OK?=0), that is if the erasing has been ineffectual on a given word, the address of the memory sector in question is stored (STORE ADDR). This is effected into a small-size read/write RAM, not shown conventional. Instead of storing the sector address, it would be possible to store the first eight bits corresponding to the column address. This storing step precedes a sector address increase (INC_SECT), which is followed by the loading (LOAD ADDR) of the address of the sector that has checked out wrong, from the read/write memory.

In essence, when arrived at the last sector the checking step reveals that a given memory word in a given sector has been erased improperly, a fresh erasing/checking step is carried out starting with that sector rather than from the beginning of the previous checking phase. After the address loading step (LOAD ADDR), a test is run to verify if the sector under examination wasn't the last sector to be checked (LASTSECT?=0); if the answer is negative, the read/check procedure is resumed. If the sector under examination is really the last to be checked (LASTSECT?=1), a final test is run to make sure that all the sectors have been erased (ALLERASED?=1). If so, the procedure can be terminated (END); otherwise the algorithm moves to a fresh erasing step (PAR_ERASE).

The erasing procedure according to this invention is especially efficient in that it allows several memory sectors to be erased in parallel and the checking procedure to be only re-run for those sectors that have checked out wrong. It can be shown, by a simulation and plots of probabilistic distribution, that the inventive method allows the erasing step to be carried out in far less time than the prior art methods. By way of example only, the time required to check one memory word or byte may be on the order of 1 ms. Assuming that half a sector of 32 kilobytes is to be checked, the checking step would take 32 ms. Where 100 erase pulses are required, the total time involved in the checking operations would amount to no more than 3.2 seconds.

Changes and modifications may be made in accordance with the method of this invention as defined by the scope of the following claims.

I claim:

1. A method of erasing an electrically programmable non-volatile matrix memory device comprising a plurality of matrix sectors and erase means for implementing an erase algorithm, the method comprising the steps of:

parallel erasing at least one of the matrix sectors;

reading and checking each erased matrix sector after an erase end pulse;

storing an address of a matrix sector being checked when the check is unfavorable;

carrying out a fresh parallel erasing step; and starting a new reading and checking step from the matrix sector that has checked unfavorably.

2. A method according to claim 1, wherein the matrix memory device comprises a flash memory.

3. A method according to claim 1, wherein the step of reading and checking comprises reading and checking each word in a matrix sector.

4. A method according to claim 1, further comprising the step of increasing an address of a matrix sector to be checked at an end of the reading and checking step; and wherein said storing step is carried out before the step of increasing the address.

5. A method according to claim 1, further comprising the steps of:

increasing an address of a matrix sector to be checked at an end of the reading and checking step; and loading the address of the matrix sector being checked after the address of the matrix sector is increased.

6. A method according to claim 1, further comprising the step of resetting a flag to have the matrix sector address increased on completion of a matrix sector checking.

7. A method according to claim 5, further comprising the step of performing a test, after the address loading step, to verify whether the sector in question was the last sector to be checked, and if not, resuming the reading and checking step.

8. A method according to claim 1, wherein the step of storing comprises storing the address into a read/write memory.

9. A method of erasing an electrically programmable non-volatile flash matrix memory device comprising a plurality of matrix sectors, the method comprising the steps of:

parallel erasing at least one of the matrix sectors;

reading and checking each word in an erased matrix sector after an erase end pulse;

storing an address of a matrix sector being checked when the check is unfavorable;

carrying out a fresh parallel erasing step; and starting a new reading and checking step from the matrix sector that has checked unfavorably.

10. A method according to claim 9, further comprising the step of increasing an address of a matrix sector to be checked at an end of the reading and checking step; and wherein said storing step is carried out before the step of increasing the address.

11. A method according to claim 9, further comprising the steps of:

increasing an address of matrix sector to be checked at an end of the reading and checking step; and loading the address of the matrix sector being checked after the address of the matrix sector is increased.

12. A method according to claim 9, further comprising the step of resetting a flag to have the matrix sector address increased on completion of a matrix sector checking.

13. A method according to claim 11, further comprising the step of performing a test, after the address loading step, to verify whether the matrix sector in question was the last matrix sector to be checked, and if not, resuming the reading and checking step.

14. A method according to claim 9, wherein the step of storing comprises storing the address into a read/write memory.

15. An electrically programmable nonvolatile matrix memory device comprising:

a plurality of matrix sectors;

means for parallel erasing at least one of the matrix sectors;

means for reading and checking each erased matrix sector after an erase end pulse;

means for storing an address of a matrix sector being checked when the check is unfavorable;

means for carrying out a fresh parallel erasing step; and means for starting a new reading and checking step from a matrix sector that has checked unfavorably.

16. A memory device according to claim 15, wherein the means for reading and checking comprises means for reading and checking each word in a matrix sector.

17. A memory device according to claim 15, further comprising means for increasing the address of a matrix sector to be checked at an end of the reading and checking step; and wherein said means for storing comprises means for storing an address of a matrix sector carried out before increasing the address.

18. A memory device according to claim 15, further comprising:

means for increasing an address of a matrix sector to be checked at an end of the reading and checking step; and means for loading the address of the matrix sector being checked after the address of the matrix sector is increased.

19. A memory device according to claim 15, further comprising means for resetting a flag to have the matrix sector address increased on completion of a matrix sector checking.

20. A memory device according to claim 18, further comprising means for performing a test, after the address loading, for verifying whether the matrix sector in question was the last matrix sector to be checked, and if not, resuming the reading and checking step.

21. A memory device according to claim 15, wherein said means for storing comprises:

a read/write memory; and means for storing the address into said read/write memory.

* * * * *